United States Patent [19]

Doyle

[11] Patent Number: 4,717,836
[45] Date of Patent: Jan. 5, 1988

[54] CMOS INPUT LEVEL SHIFTING CIRCUIT WITH TEMPERATURE-COMPENSATING N-CHANNEL FIELD EFFECT TRANSISTOR STRUCTURE

[75] Inventor: James T. Doyle, Tucson, Ariz.

[73] Assignee: Burr-Brown Corporation, Tucson, Ariz.

[21] Appl. No.: 825,863

[22] Filed: Feb. 4, 1986

[51] Int. Cl.$^4$ ............................................. H03K 17/14
[52] U.S. Cl. ........................... 307/310; 307/200 B; 307/443; 307/450; 307/451; 307/475; 307/579; 307/297; 357/41; 357/51
[58] Field of Search ........................... 357/28, 41, 51; 307/200 B, 443, 446, 448, 450, 451, 475, 491, 570, 572, 573–577, 579, 581, 584–585, 264, 296 R, 297, 310, 290

[56] References Cited

U.S. PATENT DOCUMENTS

| | | | |
|---|---|---|---|
| 4,072,868 | 2/1978 | De La Moneda et al. | 307/450 |
| 4,205,342 | 5/1980 | Darwish et al. | 357/20 X |
| 4,209,713 | 6/1980 | Satou et al. | 307/200 B |
| 4,242,604 | 12/1980 | Smith | 307/443 |
| 4,264,874 | 4/1981 | Young | 307/451 X |
| 4,333,171 | 6/1982 | Nishikubo | 368/87 |
| 4,481,521 | 11/1984 | Okumura | 357/23 |
| 4,563,601 | 1/1986 | Asano et al. | 307/443 X |
| 4,612,461 | 9/1986 | Sood | 307/443 X |

OTHER PUBLICATIONS

"Noise Immunity Improvement of CMOS–CVC Logic Circuits", IBM T.D.B., vol. 27, No. 11, Apr. 1985, p. 6794.

*Primary Examiner*—Stanley D. Miller
*Assistant Examiner*—D. R. Hudspeth
*Attorney, Agent, or Firm*—Cahill, Sutton & Thomas

[57] ABSTRACT

A CMOS input level shifting circuit includes a temperature-compensating N-channel field effect transistor structure wherein a resistance in series with the source region includes an extension of a lightly doped P-type region in which the source and drain regions are diffused. This structure produces a temperature-compensating variation in the drain current proportional to the square of the series resistance without requiring modification of standard processes for manufacturing CMOS integrated circuits. The relatively large, temperature-dependent variation of the series resistance produces a corresponding temperature-dependent variation in the drain current that effectively temperature-compensates the switching point of the CMOS input level shifting circuit.

9 Claims, 13 Drawing Figures

CMOS INPUT LEVEL SHIFTING CIRCUIT WITH TEMPERATURE-COMPENSATING N-CHANNEL FIELD EFFECT TRANSISTOR STRUCTURE

BACKGROUND OF THE INVENTION

The invention relates to field effect transistor structures, and more particularly to temperature-compensated field effect transistor circuits and to inverting CMOS circuits having trip points or switching points that are compensated for variations in temperature and are relatively independent of certain manufacturing process parameter variations.

MOS field effect transistors (MOSFETs) produce drain currents that vary considerably with temperature. The MOSFET threshold voltages are heavily dependent on various manufacturing process parameters, especially the thicknesses of the gate oxide and the doping levels of the semiconductor region in which the MOSFET source and drain regions are diffused. MOSFET threshold voltages also are quite dependent upon the temperature of the device. Those skilled in the art know that MOSFETs are widely used in manufacture of high density, high performance integrated circuits. CMOS (complementary metal oxide semiconductor) integrated structures include both P-channel and N-channel MOSFETs configured to produce very high speed, low power, high performance integrated circuits. It is usually desirable to interface CMOS integrated circuits with input circuitry and output circuitry that is implemented in other integrated circuit technologies, especially the TTL (transistor-transistor logic) technology, which is capable of producing large output currents that may be necessary to drive large line capacitances and large output loads. The logical "0" and "1" levels of standard TTL circuits vary considerably. The typical range of values for a TTL logical "0" level is 0.8 volts to zero volts. A typical range of values for a TTL "1" level is 3.5 volts to 2.7 volts. Those skilled in the art know that it is very difficult to design an economical CMOS input buffer that is of adequately high speed and can properly respond to "worst case" values of the above ranges of TTL input levels. This is because the "trip point" or "switching point" of a typical CMOS inverter structure varies considerably with circuit temperature and CMOS manufacturing parameters, so that "worst case" circuit design of TTL compatible CMOS input inverters is very difficult. Further compounding the problem is the fact that sometimes it is desirable to operate CMOS circuits at power supply voltages other than ground and +5 volts, which is the standard TTL power supply voltage. CMOS circuits have the characteristic that they can operate effectively over a wide range of power supply voltages, but the percentage variation in a CMOS inverter switching point or trip point is almost proportional to the percentage variation in the power supply voltage. As soon as the power supply voltage ($V_{DD}$) of a typical CMOS circuit is increased, it becomes impossible to drive that circuit with standard TTL logic levels. In order to provide good noise immunity for a logic circuit, including a CMOS logic circuit, it is sometimes desirable to provide hysteresis in the input circuitry of an integrated circuit chip. This is commonly done by using input latch circuits instead of non-latching input buffers. However, latch circuits are more complex and more expensive, especially if they are to be responsive to worst case TTL input voltage levels. Those skilled in the art know that providing hysteresis in a CMOS input circuit further complicates the already-difficult design problems encountered in making any CMOS circuit TTL compatible.

Those skilled in the art have utilized various modifications of standard MOS and CMOS manufacturing processes to selectively alter MOS threshold devices to achieve effective interfacing of TTL input signals to MOS and/or CMOS integrated circuits. However, alteration of any standard manufacturing process to accomplish a specific goal, for example, selectively altering MOS threshold voltages of a production process, is generally viewed as unacceptably costly and disruptive.

Despite 15 years of progress in the industry in the area of effectively interfacing TTL logic levels to MOS and CMOS circuitry, there still remains a largely unmet need for a truly economical, fast, TTL CMOS input circuit for shifting TTL input signals, which input circuit is quite independent of MOS manufacturing parameters (such as gate oxide thickness and channel doping levels) that affect MOSFET threshold voltages, which is relatively independent of temperature, which is relatively independent of MOS power supply voltages applied thereto, and which also has relatively high noise immunity.

SUMMARY OF THE INVENTION

Accordingly, it is an object of the invention to provide a MOSFET circuit that effectively provides a self-compensating MOSFET characteristic.

It is another object of the invention to provide a MOSFET circuit structure that, in effect, produces a MOSFET drain current having a predetermined amount or range of variation with respect to temperature and/or certain MOS processing parameters.

It is another object of the invention to provide a CMOS inverter circuit having a trip point that is relatively stable with respect to temperature and/or to certain CMOS manufacturing process parameters.

It is another object of the invention to provide a stable TTL compatible input circuit in a CMOS integrated circuit and which provides reliable translation of the input TTL logic levels over a wide range of temperature, CMOS processing parameters, and power supply voltages.

Briefly described, and in accordance with one embodiment thereof, the invention provides a self-compensating MOS circuit wherein a series resistance that comprises an extension of the region in which the source and drain regions of a MOS field effect transistor (MOSFET) are diffused provides effective compensation of the drain current of the field effect transistor with respect to the temperature of the circuit and also with respect to variations in MOS manufacturing parameters, such as gate oxide thickness and doping of the channel region, that effect the MOS threshold voltage. In the described structure, the voltage drop across the series resistance due to flow of drain current therein results in an increase in the effective MOSFET threshold voltage of the "composite" MOSFET in which the series resistance is "lumped" with the intrinsic source resistance. An increase in the temperature, which normally increases the MOS threshold voltage, produces a decrease in the series resistance, causing a temperature-compensating decrease in the effective MOSFET threshold voltage of the MOSFET. In the described embodiment of the invention, the self-compensating MOS circuit is contained in a CMOS inverting circuit as an inverter pull-down MOSFET having its drain electrode connected to the drain electrode of a P-channel pull-up MOSFET, the gates of both the pull-up MOSFET and the pull-down MOSFET being connected to an input conductor to which a TTL logic signal is applied. A second P-channel pullup MOSFET is provided in parallel with the first, and has its gate coupled to a feedback signal produced by a second CMOS inverting stage in order to provide a "polarized" hysteresis characteristic of the MOS level shifting circuit, making the trip point or switching point of the MOS level shifting circuit relatively independent of the power supply voltage applied across the CMOS level shifting circuit. The lightly doped P-type "well" or "tub" region in which the heavily doped N-type source and drain of the N-channel MOSFET are diffused is electrically shorted to the source of the N-channel MOSFET transistor by means of a source contact to a heavily doped P-type contact region formed in the lightly doped P-type tub region. The described circuit provides a TTL-compatible CMOS input circuit that provides effective, inexpensive, high speed interfacing to worst case applied TTL levels despite wide ranges in the P-channel MOS threshold voltages, N-channel MOS threshold voltages and despite wide variations in temperature. The CMOS input circuit also can be designed to properly respond to TTL input levels when high power supply voltages are applied to the CMOS input level shifting circuit.

DESCRIPTION OF THE INVENTION

In describing the present invention, it may be helpful to first describe the basic well-known CMOS inverter structure and its transfer characteristic and to also define its "trip point" or switching point. Referring to FIG. 2A, the CMOS inverter includes an N channel MOSFET 16 and a P channel MOSFET 17, each having its source connected to its "bulk" or "substrate" terminal, i.e., to the relative lightly doped region in which its heavily doped source and drain regions are different. Reference number 17A designates the bulk terminal of P channel MOSFET 17 and reference numeral 16A designates the bulk terminal of N channel MOSFET 16. The sources of MOSFETs 16 and 17 are connected, respectively, to ground and $+V_{DD}$. The gates of MOSFETs 16 and 17 are both connected to $V_{in}$. The drains of MOSFETs 16 and 17 are both connected to $V_{out}$.

Figure 1:
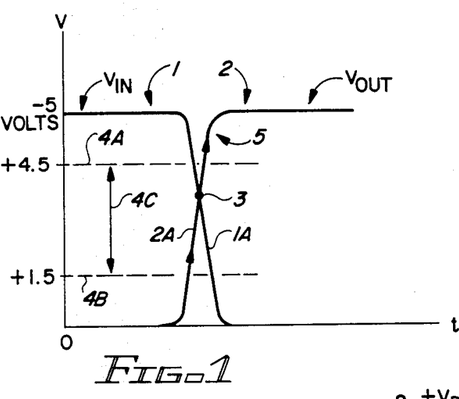
FIG. 1 is a diagram of a typical CMOS inverter transfer characteristic.

A "transfer characteristic" useful in understanding the switching operation of the CMOS inverter of FIG. 2A is shown in FIG. 1. It is assumed that the input voltage $V_{in}$ is very slowly increased from 0 to +5 volts, so that any delay between $V_{in}$ and $V_{out}$ is negligible. It is further assumed that $V_{DD}$ is equal to +5 volts. The plot of $V_{out}$ versus time is designates by curve 1. It is assumed that the geometries of MOSFET 16 and 17 are designed so that they have essentially equal, but complementary drain current characteristics.

As the $V_{in}$ curve 2 increases from 0 volts toward +5 volts, as indicated by reference numeral 2A, a point is reached at which $V_{out}$ decreases sharply (with respect to time) from +5 volts to 0 volts, as indicated by segment 1A of $V_{out}$ curve 1. The point at which $V_{out}$ is equal to $V_{in}$ is designated by reference numeral 3, and is defined as the trip point or switching point of the CMOS inverter.

In CMOS integrated circuits, the trip point is often defined to be midway between $V_{DD}$ and ground, which, in the present example, would be +2.5 volts, source $V_{DD}$ is +5.0 volts.

Those skilled in the art know that the actual value of the trip point of a CMOS inverter is highly dependent upon certain CMOS manufacturing process parameters, especially the threshold voltages of the P and N channel MOSFETs, and of course, the parameters that determine those threshold voltages, including the doping levels in the channel regions and gate oxide thicknesses. The value of the trip point of a particular CMOS inverter circuit also varies considerably as its temperature varies over the typical specification range, about −50° Centigrade to 150° Centigrade, in which CMOS integrated circuits are expected to reliably operate. Variations in the source-to-drain spacing (i.e., the channel length), which can be affected by photo etching parameters and diffusion parameters, cause variations in the trip point voltage of a CMOS inverter.

The range within which the trip point voltage of point 3 of FIG. 1 can be expected to vary for a typical CMOS manufacturing process is bounded by dotted lines 4A and 4B in FIG. 1, i.e., between about +1.5 volts and about +3.5 volts. The 2 volt difference designated by reference numeral 4C represents a 40% variation in the trip point voltage of a typical CMOS integrated circuit inverter resulting from normal CMOS process parameter variations, expressed as a percentage of the $V_{DD}$ value of 5 volts.

As previously explained, interfacing CMOS integrated circuits with TTL logic circuitry, which usually produces a maximum logical "0" level of 0.8 volts and a minimum "1" level of +2.0 volts, is a longstanding problem. Note that the 1.2 volt difference between these two levels is much less than the 2 volt range for the trip point of a typical CMOS inverter of FIG. 1.

Also note that the 1.5 bolt lower end of the 2 volt trip point voltage range for a typical CMOS inverter is shifted upward about 0.7 volts from the upper worst case TTL "0" level of 1.2 volts. These considerations obviously may cause difficulty in applying TTL output levels directly to inputs of CMOS integrated circuits operating between the same power supply voltage levels.

By varying the ratio of the channel widths of the P channel and N channel MOSFETs 16 and 17, the voltage of trip point 3 can be lowered to the middle of the preferred 0.8 volt to 2.0 volt range that is desirable for interfacing with TTL logic circuits, but even if this is done, the variation of the trip point of the CMOS inverter with normal processing parameters may result in non-symmetrical noise margins, which usually is undesirable, and sometimes may result in circuit inoperability even in the absence of noise.

Figure 3A:
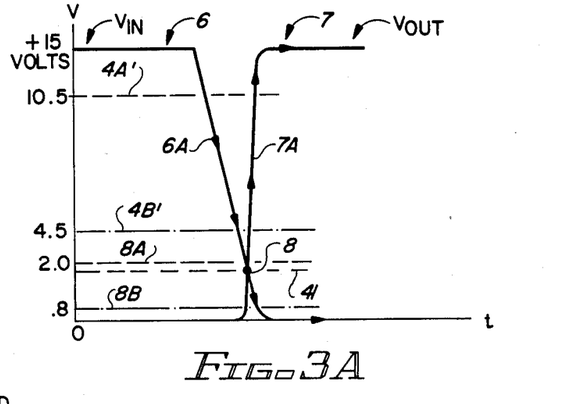
FIGS. 3A and 3B are inverter transfer chracteristics useful in describing the operation and advantage of the circuit of FIG. 2.

Those skilled in the art know that CMOS integrated circuits have a theoretical advantage in that they can be operated over a wide range of power supply voltages. This is because the trip point of a conventional CMOS inverter increases proportionally to increases in $V_{DD}$. However, the above-mentioned "window" or range of variation in the trip point voltage with respect to normal CMOS manufacturing process variations also increases. For example, if the $V_{DD}$ voltage of the CMOS inverter of FIG. 3A is increased from +5 volts to +15 volts, the trip point voltage 3 would increase from 2.5 volts to 7.5 volts, and the voltage of dotted line 4A would increase from 3.5 volts to 10.5 volts and the voltage of dotted line 4B would increase from 1.5 volts to +4.5 volts. Obviously, the CMOS inverter circuit would no longer have any possibility of being driven by TTL logic levels.

Referring to FIG. 3A, what would be desirable would be to have a CMOS input level shifter circuit that could operate with $V_{DD}$ equal to +15 volts and have the shown transfer characteristic. The dotted lines 4A' and 4B' in FIG. 3A designate the trip point range for the same CMOS inverter (or the one whose transfer circuit is shown in FIG. 1) with $V_{DD}$ equal +15 volts instead of +5 volts. Dotted lines 8A and 8B, at voltage levels of +2.0 volts and +0.8 volts, respectively, designate the desired maximum range of the trip point for good interfacing with TTL logic levels.

The problem faced in designing such a TTL-compatible CMOS interface circuit, then (with $V_{DD}=+15$ volts), is to reduce the CMOS inverter minimum trip point voltage from 4.5 volts to +0.8 volts, to reduce the maximum CMOS inverter trip point from 10.5 volts to 2.0 volts.

Figure 2:
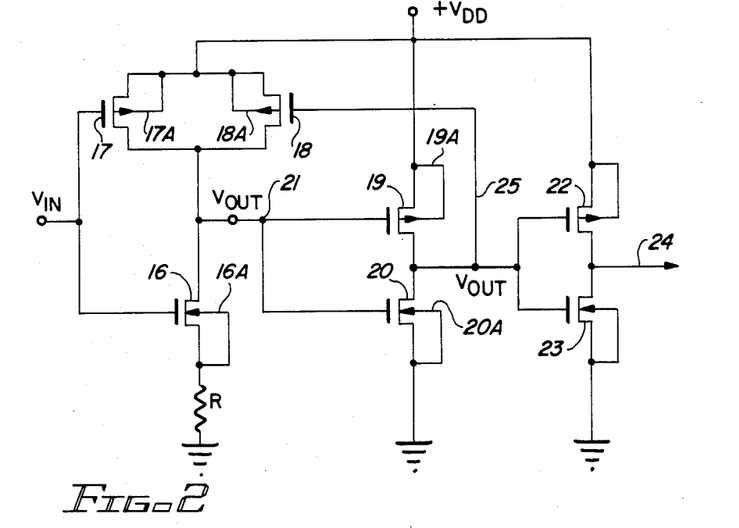
FIG. 2 is a schematic circuit diagram of a self adjusting TTL compatible input circuit according to the present invention.
Figure 2A:
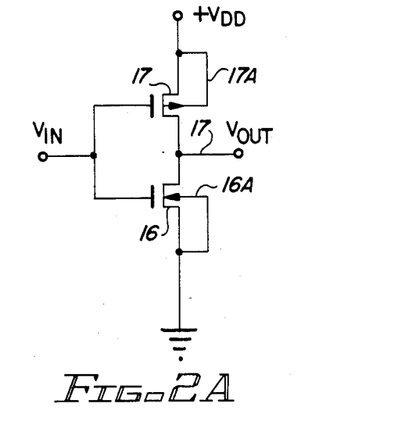
FIG. 2A is a circuit diagram of a conventional CMOS inverter.

With this background in mind, the CMOS input circuit 15 of the present invention is shown in FIG. 2. P channel MOSFET 17 and N channel MOSFET 16 have their gates connected to $V_{in}$ and their drains connected to conductor 21. Their respective structures and functions are similar to those of P channel MOSFET 17 and N channel MOSFET 16 in the conventional CMOS inverter of FIG. 2A. However, and in accordance with the present invention, the bulk terminal 16A of the N channel MOSFET 16 is not connected to ground. Instead, bulk terminal 16A and the source of N channel MOSFET are connected to one terminal of resistor R, the other terminal of which is connected to ground.

The portion of FIG. 2 just described constitutes the most basic embodiment of the input level shifting circuit of the present invention. However, in accordance with a more preferred embodiment of the CMOS input level shifting circuit, a second inverter including P channel MOSFET 19 and N channel MOSFET 20 has its input connected to $V_{out}$ conductor 21. The structure of inverter 19, 20 can be identical to the structure of the conventional CMOS inverter of FIG. 2A. Its output is connected to conductor 25. Feedback is provided from the output conductor 25 to #the gate of a P channel MOSFET 18 connected in parallel with P channel MOSFET 17. The bulk terminal 18A of P channel MOSFET 18 is connected to $+V_{DD}$.

If desired, the input of an inverter driver can be provided, which inverter driver includes P channel MOSFET 22 and N channel MOSFET 23, connected as shown. Those skilled in the art will recognize that the bulk electrodes of the N channel MOSFETs such as 20, 23 can be connected to a reference voltage below ground. The "ground" reference shown in FIG. 2 can be lower than the "ground" or common reference of the TTL circuits supplying the input voltages.

Figure 3B:
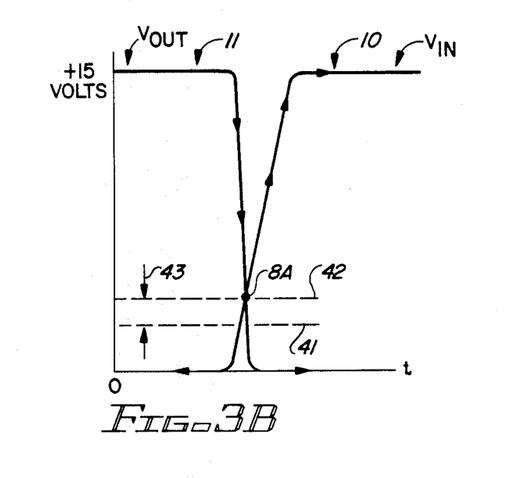

The transfer characteristics shown in FIGS. 3A and 3B show the $V_{in}$ and $V_{out}$ voltages of input level shifting circuit 15, assuming that $V_{DD}$ is +15 volts and also assuming that the slopes of the input signal $V_{in}$ are such that delay between $V_{in}$ and $V_{out}$ is negligible. The curves of FIG. 3A show $V_{in}$ and $V_{out}$ when $V_{in}$ is reduced slowly from +15 volts to 0 volts. $V_{in}$ decreases slowly, as indicated by segment 6A, until a first trip point 8 is reached, at which time $V_{out}$ increases sharply (with respect to time) from 0 volts to +15 volts, as indicated by segment 7A of $V_{out}$ waveform 7. The MOSFET device geometries are selected so that the trip point voltage, designated by dotted line 41, has a nominal value of 1.5 volts.

The operation of input level translating circuit 15 is such that initially P channel MOSFETs 17 and 18 are both off. P channel MOSFET 17 is off because $V_{in}$ is equal to $V_{DD}$. P channel MOSFET 18 is off because $V_{out}$ is 0 volts, so the voltage on conductor 25 is $+V_{DD}$ volts. Initially, N channel MOSFET 16 fully on. As $V_{in}$ decreases, P channel MOSFET 17 becomes gradually turned on, while N channel MOSFET 16 is gradually turned off, causing $V_{out}$ to increase slightly. By the time the voltage of trip point 8 is reached $V_{out}$ is increasing rapidly. CMOS inverter 19, 20 subsequently switches, causing the voltage of conductor 25 to go to ground, fully turning on P channel MOSFET 18. Parallel P channel MOSFETs 17 and 18 then rapidly pull $V_{out}$ up to +15 volts.

Referring now to FIG. 3B, the opposite switching of input level shifting circuit 15 occurs, wherein $V_{in}$ is initially 0 volts and slowly increases to +15 volts. N channel MOSFET 16 initially is completely off, and P channel MOSFET 17 initially is completely on. $V_{out1}$ is at +15 volts, so the voltage on conductor 25 is at 0 volts, causing P channel MOSFET 18 also to be on. As $V_{in}$ gradually increases from 0 volts up to trip point 8A, N channel MOSFET 16 begins to turn on, at a rapid rate with respect to time while P channel MOSFET 17 begins to turn off. However, until trip point 8A is reached, P channel MOSFET 18 remains fully on. It can be seen that the voltage level of trip point 8A in FIG. 3B, designated by dotted line 42, is significantly higher than the voltage of trip point 8 in FIG. 3A, since both P channel MOSFETs 17 and 18 are on, rather than only P channel MOSFET 17.

The voltage level of trip point 8 designated by dotted line 41 in FIG. 3A is also superimposed on FIG. 3B, and the voltage difference between the two trip point voltages 8 (FIG. 3A) and 8A (FIG. 3B) is designated by reference numeral 43, and represents the hysteresis of input level translating circuit 15.

As $V_{in}$ increases past trip point 8A in FIG. 3B, $V_{out}$ decreases further; by then, the voltage $V_{out}$ on conductor 25 has risen high enough to turn P channel MOSFET 18 completely off, and $V_{in}$ has also decreased enough to turn P channel MOSFET 17 completely off.

Figure 4A:
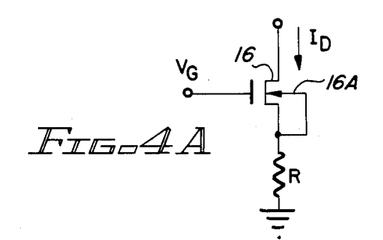
FIG. 4A is a circuit diagram of a self-adjusting MOSFET circuit used in the circuit of FIG. 2.
Figure 4B:
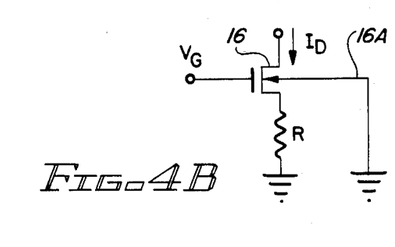
FIG. 4B is a schematic diagram of a prior art source follower circuit included for explaining, by way of comparison, the operation of the circuit of FIG. 4A.

In accordance with the present invention, the circuit consisting of N channel MOSFET 16 with both its source and bulk terminals connected to resistor R, functions as a "self-compensating" MOSFET, wherein the resistance of resistor R can be selected to cause trip points 8 and 8A (FIGS. 3A and 3B, respectively), to be very independent of temperature and certain processing parameter variations. In order to understand the operation of the combination of N channel MOSFET 16 and resistor R, it will be helpful to refer to FIG. 4A, which repeats the connection of N channel MOSFET 16 and resistor R shown in FIG. 2, and to compare the operation of that circuit with the similar, but significantly different, configuration shown in FIG. 4B. The difference between the configuration shown in FIGS. 4A and 4B is that the bulk terminal 16A of MOSFET 16 is connected to the source of N channel MOSFET 16 in FIG. 4A but is connected to ground in FIG. 4B. This is a subtle but important difference, because the "bulk term" in the equation for the threshold voltage of N channel MOSFET 16 during circuit operation increases as the voltage of the source of MOSFET 16 increases. Those skilled in the art know that the threshold voltage of MOSFET 16 in FIG. 4B rises sharply as the source voltage rises (due to the well known "body effect" on the threshold voltage, given by the equation:

$$V_T = V_{TO} + \gamma(\sqrt{2\phi_F + V_{SB}} - \sqrt{2\phi_F}) \quad (1)$$

$$\text{where } \gamma = \sqrt{2q\epsilon N}\left(\frac{1}{C_{ox}}\right),$$

$\phi_F$ being the Fermi potential of the material, $C_{ox}$ being the gate oxide capacitance per unit area, N being the impurity concentration of the bulk material, and $V_{SB}$ being the source-to-bulk voltage, which is zero for FIG. 4A, and is greater than zero for FIG. 4B), whereas the threshold voltage of MOSFET 16 in FIG. 4A remains constant and independent of the source voltage of MOSFET 16.

Those skilled in the art also know that the drain current $I_D$ is proportional to the square of the difference between the gate-to-source voltage and the threshold voltage. Therefore, the drain current $I_D$ of the self-compensating MOSFET circuit of FIG. 4A is more sensitive to changes in $V_{GS}$ than the circuit in FIG. 4B.

In accordance with the present invention, and as explained in more detail hereinafter, this phenomena is used to great advantage in order to provide automatic adjustment for or compensation of the trip point voltage of a CMOS inverter or inverter-like circuit with respect to temperature variations and process parameter variations that affect the P channel MOSFET threshold and the N channel MOSFET threshold. Before further explaining this statement, however, it will be helpful to now describe CMOS integrated circuit layout the structure shown in FIG. 5, which is a basic CMOS integrated circuit implementation of the self-adjusting MOSFET circuit shown in FIG. 4A.

Figures 5, 5A:
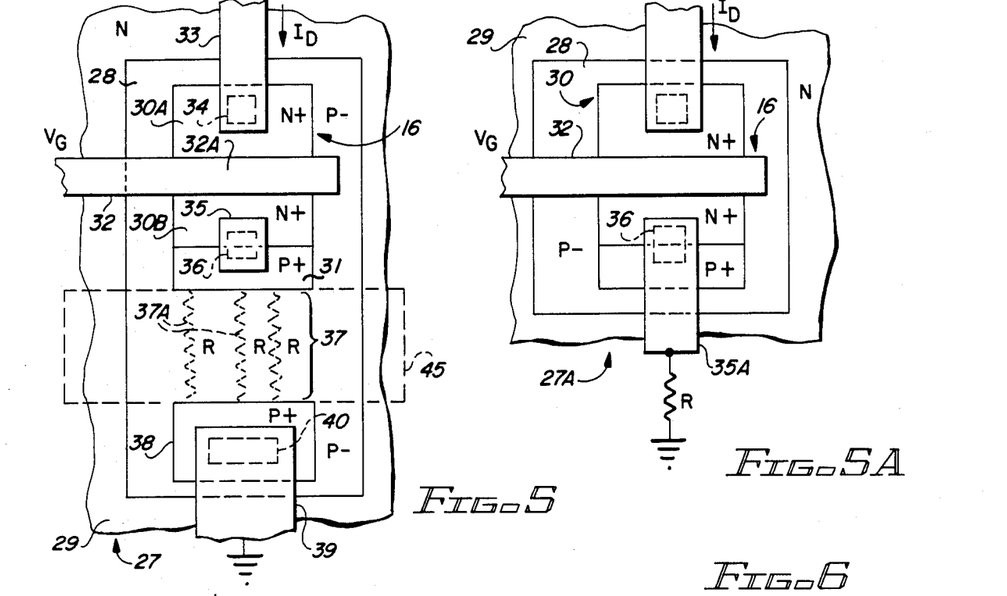
FIG. 5 is a plan view of a integrated circuit CMOS layout of the circuit of FIG. 4A.
FIG. 5A is a plan view of an integrated circuit mask CMOS layout wherein the resistor R is external to the P− well region transistors are used.

In FIG. 5, reference numeral 27 designates the self-compensating MOSFET circuit, wherein a P− type "well" or "tub" region is formed in an N type substrate 29. In the upper portion of P− well 28, a pair of N+ drain and source regions 30A and 30B, respectively, are formed, using any of a variety of well-known silicon gate CMOS manufacturing processes, in order to form N channel MOSFET 16. Gate electrode 32, which may be doped polycrystalline silicon, overlies the channel region 32A extending between the drain 30A and the source 30B of the N channel MOSFET 16. Reference numeral 33 designates a metal drain contact conductor that makes ohmic connection through an oxide opening 34 to N+ drain region 30A. The drain current $I_D$ flows through metal conductor 33.

A P+ region 31 is diffused in P− well 28 adjacent to the lower end of N+ source region 30B, hence making ohmic electrical contact to P− well 28. A metal conductor 35 electrically connects N+ source region 30B to P+ region 31 and hence to P− well 28, which forms the bulk terminal of N channel MOSFET 16, thereby shorting it to the source, as shown in FIG. 4A.

In accordance with a preferred embodiment of the present invention, the P− well region 28 extends downward a predetermined distance to a point at which a P+ contact region 38 is diffused in the lower portion of P− well 28. An electrical conductor 39 connected to ground also makes ohmic contact to P+ region 38, and hence to the lower portion of P− well 28 through oxide opening 40. The region 37 of P− well 28 constitutes the resistor R, as indicated by dotted line distributed resistors 37A.

Those skilled in the art will realize that the resistance of the distributed resistor R decreases as the doping or impurity concentration of P− well 28 increases. Such increases in the impurity concentration also increase the threshold voltage $V_{TN}$ of N channel MOSFET 16. Thus, if an increase in the impurity concentration or the nominal or design value occurs for P− well 28, the threshold voltage of N channel MOSFET 16 will increase. Ordinarily, this would decrease the drain current $I_D$ by an amount proportional to the square of the resulting increase in the threshold voltage $V_{TN}$. However, since the resistance of resistor R also decreases, it can be seen that the value of gate-to-source voltage $V_{GS}$ of N channel MOSFET 16 increases, offsetting or compensating the decrease in $V_{TN}$ caused by the corresponding increase in impurity concentration of P− well 28.

In accordance with the present invention, the nominal value of resistance of resistor R can be selected to provide an optimal amount of compensation of the variation of $V_{TN}$ caused by normal variations in the impurity concentration of P− well 28, and to also provide controlled variation of $I_D$ necessary to compensate the trip point of the circuit of FIG. 2 for variations in the N channel MOSFET threshold $V_{TN}$ and the P channel MOSFET threshold $V_{TP}$ that are in turn caused by variations in temperature and certain processing parameters.

Those skilled in the art know that the resistance of the resistor R in FIG. 5 increases as the temperature increases. If the N channel MOSFET threshold voltage $V_{TN}$ were constant, this increase in the resistance of resistor R would cause an undesirable decrease in $I_D$. However, the value of $V_{TN}$ actually decreases with temperature, so the above-mentioned increase in the resistance of resistor R automatically tends to compensate for the normal decrease in $V_{TN}$ with temperature.

As a practical matter, the resistance of resistor R can be selected to produce a partial or predetermined "compensation" of changes in the threshold voltage $V_{TN}$ with temperature to produce a desired variation in $I_D$ with temperature. In accordance with the present invention, this variation in $I_D$ is used to compensate for the variation in the threshold voltage of the P channel MOSFET 17 with variations in temperature.

The equation for the currents in the circuit of FIGS. 4A and 4B is $$I_D = \frac{Z_n \beta_n}{L_n} (V_G - I_o R - V_T)^2 \quad (2)$$

where $V_T$ is given by equation (1), $Z_n$ and $L_n$ are the channel width and channel length of the MOSFET 16, and $\beta_n$ is a constant that is proportional to the mobility of the bulk material. My simulations of the operation of the circuits of FIGS. 4A and 4B using the above equations show that the effect of the direct source-to-bulk connection of FIG. 4A, with the resistor R being formed in the bulk material in which the source and drain are formed, is to effectively compensate the current $I_D$ for increases in the threshold voltage and decreases in the mobility of the bulk material with respect to temperature.

In accordance with the present invention, the variation in the resistivity of the region 37 of P− well 28 can be controlled by controlling the doping level of P− well 28. Those skilled in the art know that high resistivity semiconductor material has a greater variation with respect to temperature than low resistivity semiconductor material. As a result of this phenomena, and in accordance with the present invention, it may be desirable to provide substantially higher resistivity material in a region 37 of P− well 28 than elsewhere therein. In this event, an alternate manufacturing technique can be provided wherein the P− well region 28 is diffused into the N-type substrate 29 after the gate oxides and polycrystalline silicon pattern has been deposited but before the source and drain regions are formed.

In FIG. 5, reference numeral 45 discloses a "floating" layer of polycrystalline silicon on a thin oxide formed at the same time that the gate oxide (under the polycrystalline silicon gate conductor 32 of N-channel MOSFET 16) is formed. This results in more masking of P type impurities being diffused into a substrate at the time P− well 28 is formed, and hence in a much higher resisitivity or sheet resistance in region 37 of P− well 28 than elsewhere therein. The sheet resistance in region 37 is about 5,000 ohms per square if the P− well 28 is diffused after the gate oxide and polycrystalline silicon patterns are provided on the integrated circuit being manufactured, while elsewhere in the P− well region 28 the sheet resistance is about 1.5 kilohms per square.

Figure 9:
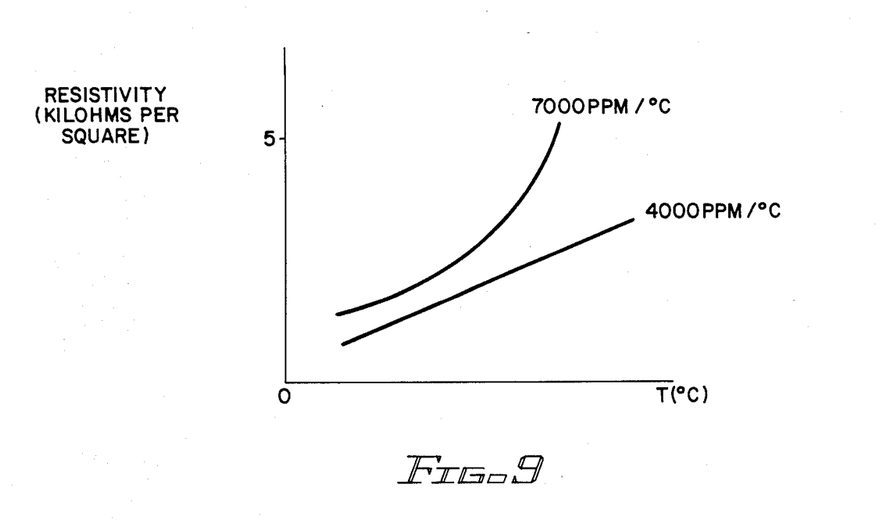
FIG. 9 is a graph illustrating the resistivity of the resistance connected in series with the source of the integrated circuit structure of FIG. 5 as a function of temperature for two different MOS manufacturing processes.

The variation in sheet resistance in region 37 then is about 7,000 parts per million per degree Centigrade, while elsewhere, in the 1.5 kilohms per square portions, the temperature variation in sheet resistance is only about 4,000 parts per million per degree Centigrade. In this case the upper curve in FIG. 9 shows a higher, non-linear temperature variation in the resistivity in region 37 of FIG. 5, while the lower curve shows a lower, more linear temperature variation of the resistivity of the channel region of MOSFET 16.

The higher sheet resistance in region 37 would, of course, allow the desired value of resistor R to be obtained using less chip area than if the sheet resistance is lower. The non-linearity of the upper curve in FIG. 9 can be used to advantage in providing a predetermined variation in the value of the drain current $I_D$ with respect to temperature variations.

When the structure shown in FIG. 5 is used in the circuit of FIG. 2, and the MOSFET geometries indicated in Table 1 below are used, the dimensions of region 37 in FIG. 5 are 50 microns between P+ regions 31 and 38 and the width of region 37 is 11 microns, and the sheet resistance of region 37 has 1.5 kilohms per square at +25° C., then the value of resistor R is about 2.7 kilohms at +120° C. if the floating polycrystalline silicon layer 45 is not used as described above. If the floating polycrystalline silicon layer 45 is used, the sheet resistance, at room temperature, of region 37 is about 5 kilohms per square.

TABLE 1

| MOSFET | CHANNEL LENGTH (L) (microns) | CHANNEL WIDTH (W) (microns) |
|---|---|---|
| 16 | 7 | 300 |
| 17 | 50 | 10 |
| 18 | 150 | 10 |
| 19 | 7 | 21 |
| 20 | 7 | 63 |
| 22 | 7 | 21 |
| 23 | 7 | 63 |

Figure 6:
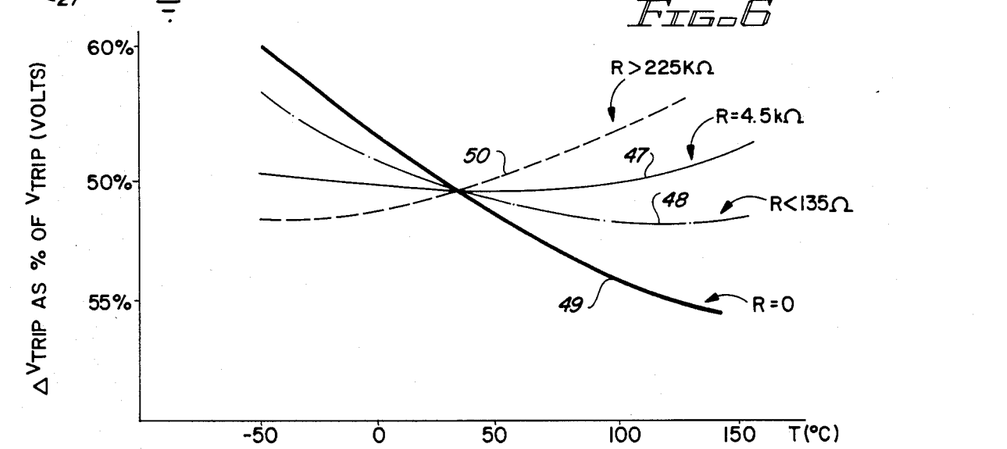
FIG. 6 is a graph illustrating the variation in the trip point of the circuit of FIG. 2 as a function of temperature and value of the resistance connected in series with the source of the input MOSFET.

Reference numeral 47 in FIG. 6 shows the variations in the trip point voltage ($V_{TRIP}$) of input level shifting circuit 15 as a function of temperature. It can be seen that the trip point voltage is essentially independent of temperature over the range from −50° Centigrade to +150° Centigrade. Curve 48 illustrates the drift of the trip point voltage for a lower value of R, and curve 49 shows the limiting case in which the value of R is reduced to 0. Curve 50 illustrates how the temperature variation of the voltage trip point of input the level shifting circuit of FIG. 2 varies as the value of R increases above the optimum value corresponding to curve 47.

Figure 7:
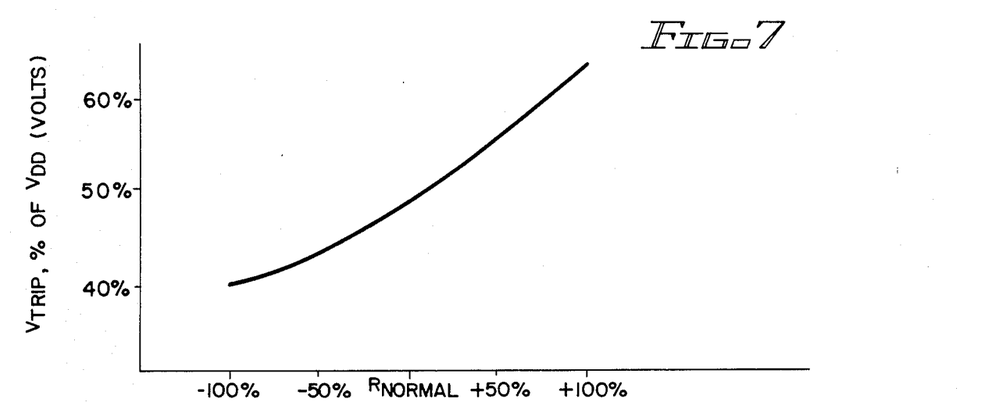
FIG. 7 is a graph illustrating variation of the trip point of the circuit of FIG. 2 as a function of variation in the series resistance connected to the source of the input MOSFET of the circuit of FIG. 2.

The curve shown in FIG. 7 is a graph of the variation in the trip point voltage $V_{TRIP}$ of a CMOS inverter using the self-compensating N channel MOSFET structure shown in FIG. 5, as a function R. A variation in $V_{TRIP}$ is expressed as a percentage of $V_{DD}$. The resistance of R is expressed as a percentage of a nominal value of R. This curve shows that significant adjustments in the trip point voltage of a CMOS inverter incorporating the self-adjusting N channel MOSFET circuit of the present invention can be achieved by simply varying the resistance of R, for example, by varying the channel width of the N channel MOSFET therein.

Figure 8:
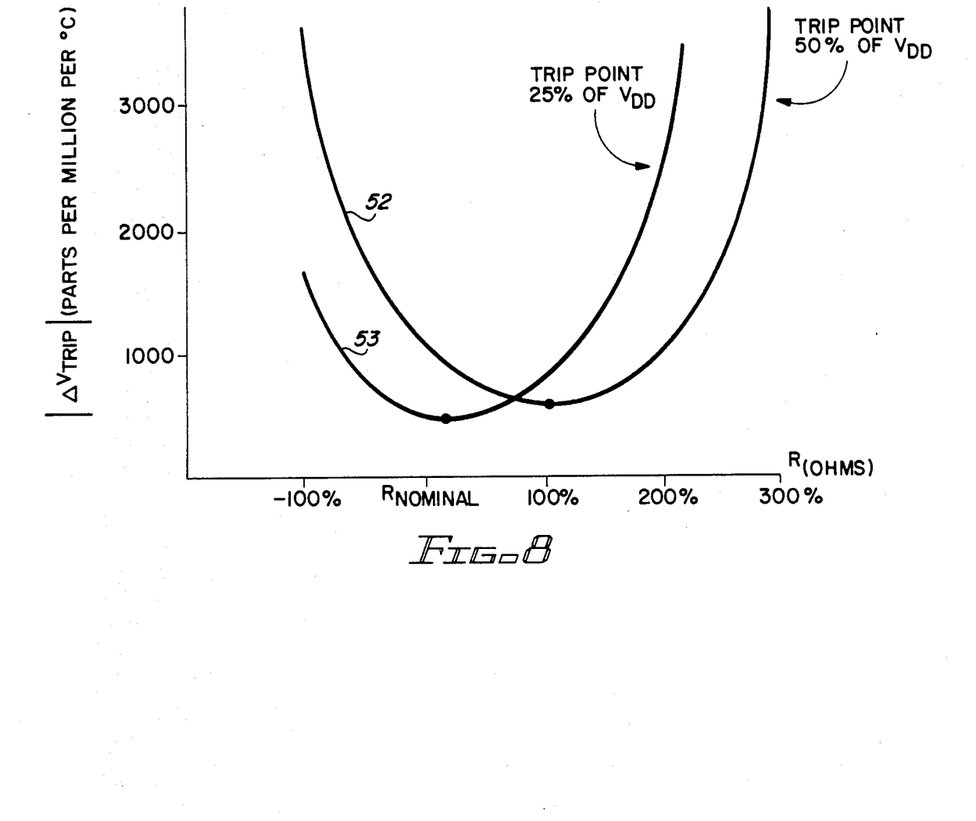
FIG. 8 is a graph illustrating the value of change in the trip point as a function of the resistance in series with the source of the input MOSFET.

FIG. 8 shows two curves 52 and 53. Curve 52 represents the absolute value of the change in the trip point voltage $V_{TRIP}$ of a CMOS inverter structure incorporating the self-compensating N channel MOSFET circuit of FIG. 5, designed to produce a nominal inverter trip point voltage equal to 50% of $V_{DD}$. Curve 53 is a similar curve for an inverter structure having device parameters designed to provide a nominal trip point voltage equal to one-fourth of $V_{DD}$. For both curves 52 and 53, it is assumed that $V_{DD}$ is constant; it is also assumed that the MOSFET geometries of the P channel and N channel MOSFETs of the CMOS inverter are constant. The lowest point on each curve represents an optimal value of resistor R that minimizes the drift of the trip point voltage $V_{TRIP}$ with respect to temperature. Although not shown herein, similar curves can be plotted to determine optimum values of various other parameters, including CMOS manufacturing parameters such as the impurity concentration levels in P− well region 28, gate oxide thicknesses, etc.

An analysis of the trip point of the CMOS inverter structure consisting of P channel MOSFET 17, N channel MOSFET 16, and resistor R of FIG. 2 can be obtained by equating equation (2) above (with $V_G = V_{IN}$) to the following equation for the current through the P channel MOSFET:

$$I_D = \frac{Z_p \beta_p}{L_p} (V_{DD} - V_{IN} - V_T)^2 \quad (3)$$

My simulations based on these equations show the values of channel lengths for the N channel and P channel MOSFETs can be selected that result in effective temperature compensation of the inverter trip point, with a substantial smaller value of, and hence a small physical size of resistor R for the circuit of FIG. 2 than in the case for a conventional CMOS inverter, or even a circuit identical to the one of FIG. 4A except that the bulk of the N channel MOSFET 16 is connected to ground instead of its source.

Other structures than the one shown in FIG. 5 can be readily envisioned. For example, a "closed" N channel MOSFET structure can be provided, wherein the source region is an annular or completely closed region that surrounds the drain region. Closed structures for the implementation of resistor R in P− well region 28 also can be readily envisioned. Furthermore, it is not necessary the resistor R be formed in the P− well region 28. Structures such as the one shown in FIG. 5A, wherein the resistor R is provided external to the P− well region 28 can be utilized. Normally, however, it will be advantageous to use a resistor R having a predetermined temperature coefficient so that its effect on $I_D$ can be utilized to provide temperature compensation of other components in the circuit within which the circuit structure of FIG. 5A is used.

Thus, the invention provides a simple MOSFET circuit structure that operates, in effect, as a voltage controlled, temperature-compensated MOSFET or voltage controlled resistor, wherein the amount of variation of the drain current as a function of temperature can be effectively controlled, especially if the resistance R is implemented in the semiconductor material in which the N channel MOSFET source and drain regions are formed. The physical size of the CMOS input circuit that receives typical worst case TTL logic levels and accurately translates them to internal CMOS logic levels over a wide range of temperature variations, certain CMOS processing parameter variations, and power supply variations has been provided. The described structures are economical in that they require relatively few circuit components and relatively little semiconductor chip surface areas. The temperature-compensated MOSFET or voltage controlled resistor of the invention can be utilized in other applications than those described above, for example, in digital or analog circuits such as precision current sources, precise oscillators, and single-ended comparators. The stability of the temperature-compensated MOSFET or voltage controlled resistor of the present invention is expected to make it much easier for a user to design MOS and CMOS integrated circuits and make corresponding IC photomasks "in house", and commission processing masks therefor so-called "silicon foundries" to manufacture the integrated circuits from the user supplied photomasks. Slight variations in the manufacturing processes of various "silicon foundries" (which are organizations that specialize in processing integrated circuits using photomasks supplied by others) will not lead to inoperativeness or inadequate performance of the manufactured integrated circuits.

While the invention has been described with reference to several particular embodiments thereof, those skilled in the art will be able to make various modifications to the described embodiments of the invention without departing from the true spirit and scope thereof. It is intended that all devices and methods that are equivalent to those described and claimed herein in that they perform substantially the same function in substantially the same way to accomplish substantially the same result are within the scope of the present invention. For example, those skilled in the art will recognize that the P channel MOSFETs could be fabricated in N channel wells or an N type substrate,

I claim:

1. A TTL-compatible CMOS input inverting circuit comprising in combination:
   (a) a first P-channel insulated gate field effect transistor having a source electrode coupled to a first supply voltage conductor, a gate electrode copuled to an input conductor, a drain electrode, and a bulk electrode coupled to the first supply voltage conductor;
   (b) a first N-channel insulated gate field effect transistor having a gate electrode coupled to the input conductor, a drain electrode coupled to the drain electrode of the first P-channel insulated gate field effect transistor, a source electrode, a bulk electrode, and means for coupling the bulk electrode and source lectrode of the first N channel insulated gate field effect transistor together; and
   (c) resistor means having a first terminal coupled to the source and the bulk electrodes of the N-channel insulated gate field effect transistor and a second terminal coupled to a second supply voltage conductor, for compensating a trip point of the CMOS input inverting circuit with respect to temperature, the CMOS input inverting circuit also comprising a first output conductor coupled to the drain electrodes of the first and second insulated gate field effect transistors.

2. The TTL-compatible CMOS input inverting circuit of claim 1 wherein a source region and a drain region of the N-channel insulated gate field effect transistor is disposed in a lightly doped P-type well region formed in an N-type substrate and the resistor means is included in the lightly doped P-type well region, said resistor means including an extension of the lightly doped P-type well region, the extension being disposed on an opposite side of the source region of the N-channel insulated gate field effect transistor from a channel region of the N-channel insulated gate field effect transistor.

3. The TTL-compatible CMOS input inverting circuit of claim 1 herein the resistor means has a resistivity that is substantially higher than the resistivity of the portion of the lightly doped P-type well region beneath the channel region of the N-channel field effect transistor to thereby cause the resistor means to produce substantially different variation with respect to temperature in the gate to source voltage of the N-channel field effect transistor and hence in the drain current thereof than would be the case if the resistivities of the resistor means and the portion of the lightly doped P-type well region beneath the channel region of the N-channel field effect transistor are equal.

4. The TTL-compatible CMOS input inverting circuit of claim 2 wherein the means for coupling the bulk and source electrodes include a heavily doped P type region disposed in the lightly doped P type well region adjacent to the source region of the N-channel insulated gate field effect transistor and conductive metal means contacting both the source region of the N-channel insulated field effect transistor and the heavily doped P type region through an oxide opening.

5. The TTL compatible CMOS input inverting circuit of claim 2 further comprising a hysteresis circuit including:
 a second P-channel insulated gate field effect transistor having a source electrode coupled to the first supply voltage conductor, a bulk electrode coupled to the first supply voltage conductor, a drain electrode coupled to the drain electrode of the first P-channel insulated gate field effect transistor, and a gate electrode; and
 a CMOS inverter circuit having an input coupled to the first output conductor and having a second output conductor coupled to the gate electrode of the second P channel insulated gate field effect transistor.

6. The TTL-compatible CMOS input inverting circuit of claim 5 further including CMOS output driver circuit means having an input connected to the second output conductor for producing CMOS logic levels to be applied to other CMOS circuitry of the integrated circuit.

7. An insulated gate field effect transistor circuit for producing a drain current with a predetermined variation with respect to temperature, the circuit comprising:
 (a) an insulated gate field effect transistor having a gate electrode for receiving a control signal, a source electrode, a drain electrode for supplying the drain current, and a bulk electrode;
 (b) a resistor having a first terminal connected to both the source electrode and the bulk electrode and a second terminal connected to a reference voltage conductor; and
 (c) temperature-dependent circuitry connected to the drain electrode and responsive to the drain current of the insulated gate field effect transistor and requiring the predetermined variation in the drain current with respect to temperature, the resistor having a temperature-varying resistance that produces a portion of the predetermined variation of the drain current, with respect to temperature.

8. An insulated gate field effect transistor circuit for producing a drain current compensated for changes due to temperature and/or manufacturing parameter variations, comprising in combination:
 (a) an N-channel insulated gate field effect transistor having an N-type drain region through which the drain current flows and an N-type source region both disposed in a relatively lightly doped P-type region, and a gate electrode for receiving a control signal; and
 (b) resistive means coupled between the source region and a reference voltage conductor for producing a first voltage in response to current flowing through the field effect transistor and applying the first voltage to both the source region and the lightly doped P-type region in order to reduce an effective threshold voltage, at which effective threshold voltage a predetermined drain current flows, of the field effect transistor circuit by an amount correspoding to the product of the drain current and resistance of the resistive means.

9. A method of producing a predetermined variation, with respect to temperature, in the drain current of an N-channel insulated gate field effect transistor disposed in an integrated circuit, the method comprising the steps of:
 (a) simultaneously forming first and second lightly doped P-type regions of semiconductor material in an N type region of semiconductor by diffusing P type impurities from a common source into corresponding first and second portions of the N type region, respectively;
 (b) forming heavily doped N type source and drain regions in the first region of lightly doped P type semiconductor material; and
 (c) forming a resistor in the second lightly doped P-type region of semiconductor material by electrically connecting a first portion of the second region of lightly doped P type semiconductor material to the source region and forming an electrical connection between a supply voltage conductor and a second portion of the second lightly doped P-type region of semiconductor material spaced sufficiently far from the first portion to provide the predetermined variation, with respect to temperature, in the drain current of the N-channel insulated field effect transistor.

* * * * *